United States Patent
Kurtz et al.

(12) United States Patent
(10) Patent No.: US 8,013,453 B2
(45) Date of Patent: Sep. 6, 2011

(54) LEADLESS ALIGNMENT OF A SEMICONDUCTOR CHIP

(75) Inventors: Anthony D. Kurtz, Saddle River, NJ (US); Joseph Van DeWeert, Maywood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 926 days.

(21) Appl. No.: 12/004,638

(22) Filed: Dec. 22, 2007

(65) Prior Publication Data

US 2009/0160069 A1    Jun. 25, 2009

(51) Int. Cl.
*H01L 23/52* (2006.01)
*H01L 21/00* (2006.01)

(52) U.S. Cl. ......... 257/778; 257/E23.141; 257/E21.001; 438/108

(58) Field of Classification Search ........... 257/678–733, 257/787–796, E23.001–E23.194
See application file for complete search history.

(56) References Cited

U.S. PATENT DOCUMENTS 5,955,771 A * 9/1999 Kurtz et al. .................... 257/419
6,561,836 B1 * 5/2003 Marshall et al. ............... 439/378

* cited by examiner

*Primary Examiner* — N Drew Richards
*Assistant Examiner* — Mamadou Diallo
(74) *Attorney, Agent, or Firm* — Troutman Sanders LLP; James E. Schutz; Jihan A. R. Jenkins

(57) ABSTRACT

There is disclosed a mounting technique for mounting a semiconductor chip of the leadless or so-called flip chip type to a header. The header has an insert made of glass or other suitable non-conductive material within the header hollow. Mounted into the glass insert are a series of conductive metal pins which are placed in areas so that when a chip is mounted in the header, the chip makes contact with these conductive pins and allows one to make outside connections. Also positioned in the header are a series of nonconductive guide pins. These pins are placed in suitable positions in the header to enable one to contact the outside surfaces of the chip when the chip is placed in the header. In this manner, the chip is constrained from movement from side to side or from rotation. However, due to the positioning of the nonconductive pins within the header, it is possible to move the chip up and down while mounting.

19 Claims, 2 Drawing Sheets

LEADLESS ALIGNMENT OF A SEMICONDUCTOR CHIP

FIELD OF THE INVENTION

This invention relates to the alignment or placement of a semiconductor chip on to a header or more particularly to the placement of a semiconductor chip onto a glass or metal header using non-conductive guide pins.

BACKGROUND OF THE INVENTION

Normal conventional semiconductor chips are easy to mount onto various headers including glass headers because careful alignment is not required. This is because the chip is not connected, to the pins but is connected through wires or leads to the pins. The wires can be ball bonded to the pins and may be gold wires. Therefore, careful alignment is not needed. However, when one is dealing with a leadless or flip chip design, much more careful alignment is necessary. For example, reference is made to U.S. Pat. No. 5,955,771 entitled "Sensors for use in High Vibrational Application Fabricating the Same", issued on Sep. 21, 1999 to A. D. Kurtz et al. and assigned to Kulite Semiconductor Products, Inc. That patent discloses what is referred to as a leadless sensor device. As seen in that patent, the sensor device is eventually coupled to a header and has to be so constructed and coupled in order to make proper contact. In dealing with such devices, the pins must make intimate contact with the conductive areas of the chip in order to form the electric circuit. The problem is further compounded by the fact that optical alignment is impossible because during the mounting, the chip covers the pin and it is not possible to see the pins.

The present invention is concerned with a solution to solve the above-noted problem.

SUMMARY OF THE INVENTION

There is described an apparatus and a method of mounting a leadless or flip chip semiconductor circuit to a header. The invention includes both the method and the header. The header basically is a shell member of a tubular configuration having an open top and an open bottom. A first glass or insulative member is disposed in the hollow of said shell member closest to the bottom opening. The glass member has a top and a bottom surface, with the top surface facing the top opening of said shell member. There is a first plurality of conductive pins directed through the insulative member and extending to the top surface of said member, with the pins extending out of said bottom opening and there is at least one nonconductive guide pin extending from the top surface of the insulative member and positioned within the hollow of said shell member to contact with the side surface of said semiconductor chip when the chip is accommodated by said header. The guide pin is operative to enable proper alignment of said chip with respect to said header. The guide pin further prevents the chip from moving side to side or from rotating to thereby allow proper contact with the conductive pins of the header.

DETAILED DESCRIPTION OF THE FIGURES

Figure 1A:
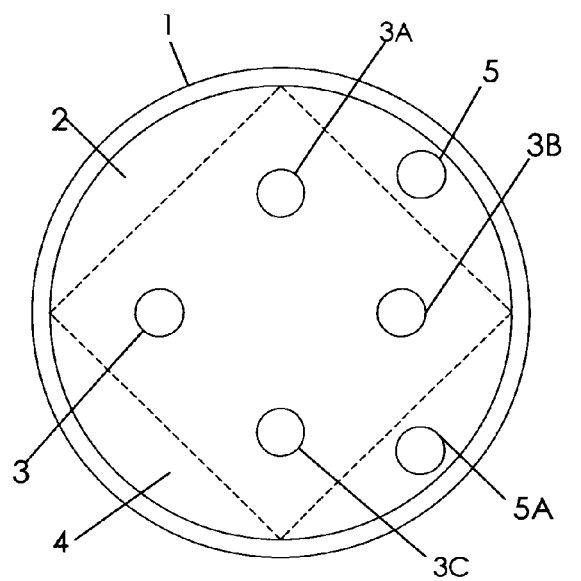
FIG. 1A shows a top view of the header apparatus according to this invention and prior to mounting a semiconductor chip.

Referring to FIG. 1A there is shown a top view of a header 1 prior to the mounting of the semiconductor chip. Header 1 typically is a metal header and has an insert 2 of glass or another suitable non-conductive or isolative material such as a high temperature ceramic. Mounted into the glass insert 2 are a series of conductive metal pins labeled as 3, 3A, 3B, and 3C. These metal or conductive pins are placed in areas such that when the semiconductor chip is mounted on the header, the contacts of the chip directly contact the pins to create the conductive path from the chip through the header. This is well known and is shown in many prior art patents, including the above-noted U.S. Pat. No. 5,955,771. In any event, as shown outside the area where the chip is to be placed, designated as area 4, are a series of pins as 5 and 5A. The dotted line in FIG. 1A shows where the chip would be positioned when the chip is mounted or accommodated on the header. In any event, pins 5 and 5A designate the presence of two nonconductive or guide pins, the guide pins can be fabricated from a non-conductive material such as sapphire or other material. In general, for a square chip, two pins such as 5 and 5A are necessary to properly align the chip. It is understood that more or less pins are also possible depending on the chip and header design. Thus, for a circular chip, one may employ a different number of pins as 5 and 5A.

Figure 1B:
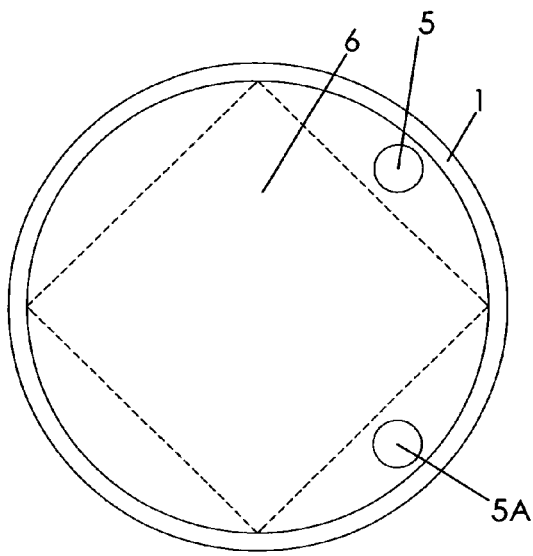
FIG. 1B shows the header of FIG. 1A with a semiconductor chip mounted thereon.

Referring to FIG. 1B, there is shown the same header 1 after a semiconductor chip 6 has been mounted to the header. Typically, the chip 6 will be mounted with a high temperature glass or epoxy although other mounting or bonding techniques are possible. It is seen from FIG. 1B that the chip 6 cannot move from side to side or rotate because of the presence of the pins 5 and 5A. The pins abut or basically contact the sides of the chip and therefore prevent the chip from rotating in any direction or from moving in a side direction. It is possible to move the chip up and down, but by placing the chips firmly against the pins as 5 and 5A, it is possible to constrain the side movement of the chip while the chip is being mounted. As one can therefore ascertain, once the chip is placed on the header, the sides of the chip will contact the non-conductive pins 5 and 5A and the chip can be moved up and down with respect to these pins, but cannot be easily moved sideways. This is because of the constraints imposed by the inner wall of the header 1 as will be further explained. As one will ascertain, because the pins 5 and 5A are made of the non-conductive material and therefore any electrical problems regarding shorts or the lowering of isolation resistance are totally avoided.

Figure 2A:
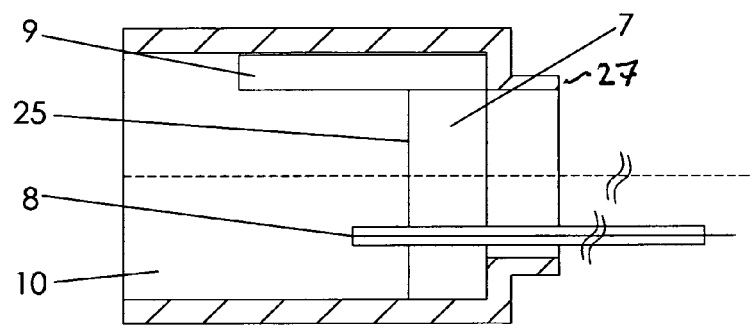
FIG. 2A shows a side cross-sectional view of the header of FIG. 1 showing one layer of glass.

Referring to FIG. 2A, there is shown a side cross-sectional view of the header 10 according to this invention. In FIG. 2A, there is a single layer of glass 7 in which all of the pins, both conductive pins 8 and non-conductive pings 9 are mounted. The glass member 7 is also sealed to the metal header 10. This seal can be performed in many ways and it is known by those skilled in the art how to do this. As seen, the metal header shelf 10 the chip would be placed in the open top of the header 10 and abuts against the non-conductive pins 9 and its counterpart 9A not shown. These would be analogous to pins 5 and 5A of FIG. 1B. As see, the chip can move up and down within the wall of the header and only constrained by the positioning of the non-conductive pins 9 as 5 and 5A of FIG. 1. It is noted that the pins 5 and 5A as pin 9 extend well above the surface 25 of the glass member surface 25. As seen, the header 10 is a longitudinal tubular member symmetrically disposed about the central axis 50 and has an opened top 40 and an opened bottom 41.

Figure 2B:
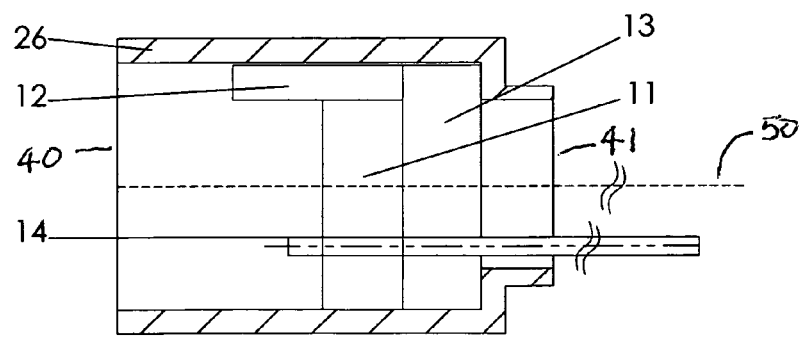
FIG. 2B shows a side cross-sectional view of the header of FIG. 1 using two glass layers.

Referring to FIG. 2B, there is shown an alternate embodiment. In FIG. 2B the header 26 which is also a metal header has two layers of glass as layers 11 and 13. The first layer of glass 11 has all of the pins embedded as in the previous figure. However, for certain glasses and pin types it is difficult to obtain an hermatic seal to the nonconductive pins as pin 12 which is analogous to pin 9 of FIG. 2A and pins 5 and 5A of FIG. 1. While the seal is sufficient to hold the pins firmly, it does not create an hermatic seal which is necessary if the device is to be used as a pressure transducer or to be used in a harsh environment. In order to make this seal, it is necessary to have the second piece of glass 13. Ultimately, the conductive pins as pins 14 go through this piece of glass 13 and also through glass 11 so that a good seal is formed around the pins 14 and the rim of the header. In this manner, the first piece of glass 11 is used only to hold the pins, whereas the second piece 13 is used for sealing. This two layered glass approach provides the advantages the advantage of allowing the non-conductive pin 14 to be near or in contact with the header shelf. Normally, with the pins that close to the shell, there would be no way to seal. However, because the pins go through the first piece of glass and the second piece, the second piece seals easily. This is beneficial it allows the header to be smaller because it does not need the extra space between the non-conductive pins as 9 and the outside edge.

Figure 3:
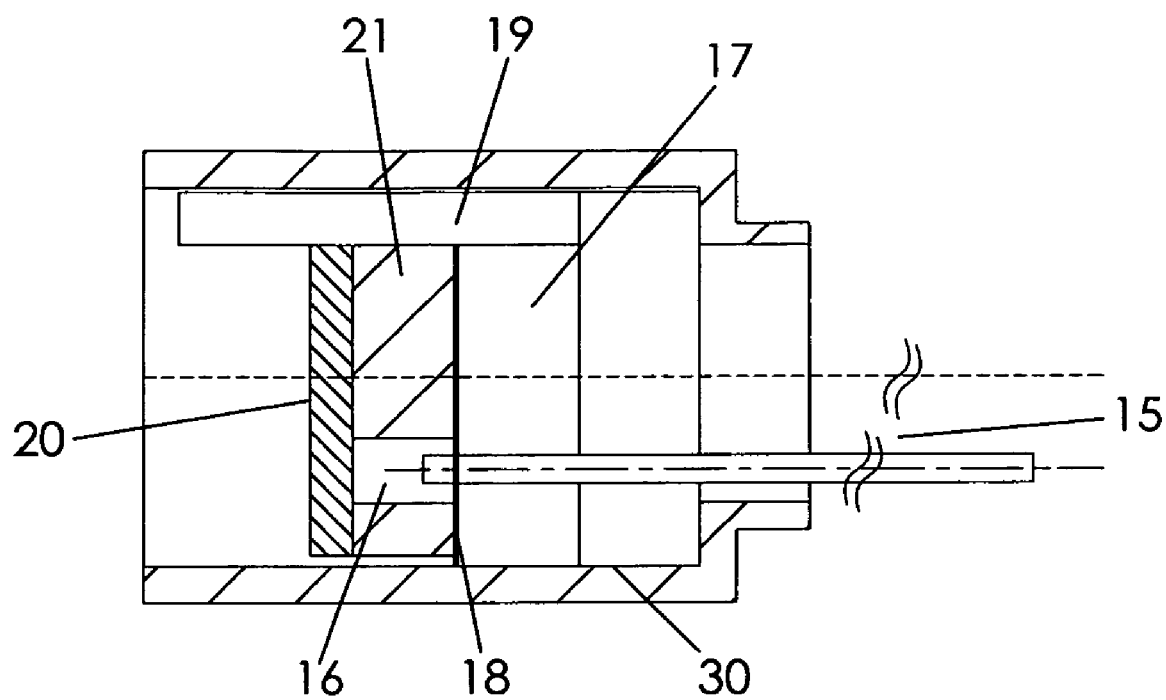
FIG. 3 shows a side sectional view of the header having a semiconductor chip is mounted thereon.

Referring to FIG. 3, there is shown a side cross-sectional view of the header 30 with the semiconductor chip 20 mounted thereon. It can be seen from FIG. 3 that the conductive pins 15 are in contact with the vias 16 that go through the glass pedestal 21 allowing connections through a conductive glass to the chip 20. The chip is then mounted to the header glass 17 with a high temperature glass bond 18. Glass 18 can be a glass suit made of a high temperature glass which will melt or seal or bond chip to the header glass. The non-conductive pins 19 are embedded in the first layer of header glass 17 while the conductive pins 15 go through both layers. It is then possible to connect the wires to the opposite sides of those conductive pins to route the signal to the outside. As one can ascertain, the present invention makes it possible to easily align and mount leadless or flip chip style semiconductor chips to headers. This is the case where pressure sensors as well as other types of semiconductor chips are needed. This alignment is made easier by both constraining the chip and providing optical cues for alignment. The cues, of course, are the nonconductive pins. This is the case for both manual alignment as using a technician to align the chips in the header as well as automatic alignment where a machine is used for alignment.

Thus, the present invention makes it much easier to quickly and effectively align because mere is only one possible way to mount the chip.

It is of course understood that there may be many alternative approaches to the present invention, including the use of multiple nonconductive pins to align different shaped semiconductor chips as well as to incorporate such nonconductive alignment pins into other headers of other geometrical forms. All such embodiments and alternative designs are deemed to be incorporated within the scope of the claims appended hereto.

What is claimed is:

1. A method of mounting a leadless or flip chip of a given geometrical configuration to a header, said header having a chip accommodating insulative surface surrounded by said shell and having a series of conductive pins extending from said insulative surface and positioned to contact terminals of said chips when said chip is placed in said header to enable connections to be made to said chip, comprising the steps of:
   a) placing at least one non-conductive pin on said insulative surface and within said header shell and positioning said at least one non-conductive pin at a place wherein when said semiconductor chip is placed in said header and said non-conductive pin acts as a guide to enable said chip to be placed in said header while said pin prevents movement of said chip as rotational or side to side movement without penetrating the chip; and
   b) placing a first layer of glass in said shell and directing all pins both conductive and nonconductive through said first layer and sealing said glass layer to the inner wall of said header.

2. The method according to claim 1, wherein said chip is generally square in shape, having four sides, and the steps of placing at least one pin include placing inside two pins each for contacting an adjacent side of said chip to prevent said chip from moving side to side or rotating during placement.

3. The method according to claim 1, wherein said header is metal.

4. The method according to claim 1, wherein said insulative pins extend above said insulative surface.

5. The method according to claim 1, wherein said insulative pins are fabricated from sapphire.

6. The method according to claim 1, further including the step of:
   a) placing a second layer of glass beneath said first layer and only directing the conductive pins though said second glass layer and also said first layer;
   b) sealing said conductive pins to at least one of said layers of glass; and
   c) sealing said second layer of glass to said header to create a hermetic seal.

7. A header for accommodating the mounting of a semiconductor chip of a given geometrical configuration, comprising:
   a) a shell member of a tubular configuration having an opened top and opened bottom and a first insulative member disposed in the hollow of said shell member closer to the bottom opening, said insulative layer having a top and bottom surface with the top surface racing said opened top of said shell member, and
   b) at least one non-conductive guide pin extending from said insulative member and positioned within said hollow whereby when said chip is accommodated by said header, said guide pin is operative to enable proper alignment of said chip with respect to said header, and
   c) wherein said semiconductor chip is of a relatively polygonal configuration and said header has two guide non-conductive pins extending from the top surface of said insulative member and positioned to contact adjacent sides of said chip to prevent said chip from rotating or moving side to side without penetrating the chip.

8. The header according to claim 7, further including a second insulative member positioned within said hollow and located below said first insulative member, said second member having said conductive pins directed there through.

9. The header according to claim 7, wherein said first insulative member is fabricated from glass.

10. The header according to claim 8, wherein said second insulative member is fabricated from glass.

11. The header according to claim 7, wherein said header is a metal header.

12. The header according to claim 7, wherein said insulative member is sealed to said shell member.

13. The header according to claim 7, wherein said semiconductor chip is a leadless pressure sensor chip.

14. The header according to claim 7, wherein said semiconductor chip is a flip chip.

15. The header according to claim 8, wherein said second glass member is sealed to said conductive pins.

16. The header according to claim 7, wherein said semiconductor chip is of a relatively square configuration.

17. The header according to claim 16, wherein said guide pins are fabricated from sapphire.

18. The header according to claim 7, further including a plurality of nonconductive guide pins extending from the top surface of said first insulative member.

19. The header according to claim 16, wherein said chip is secured to said header by a high temperature glass bond.

* * * * *